(12) United States Patent
Chan et al.

(10) Patent No.: US 12,376,220 B2
(45) Date of Patent: Jul. 29, 2025

(54) CIRCUIT BOARD STRUCTURE FOR MOBILE PCI EXPRESS MODULE

(71) Applicant: ADLINK Technology Inc., Taoyuan (TW)

(72) Inventors: Dong-Rui Chan, Taoyuan (TW); Min-Lun Huang, Taoyuan (TW); Juang-Shin Chen, Taoyuan (TW)

(73) Assignee: ADLINK Technology Inc., Taoyuan (TW)

(*) Notice: Subject to any disclaimer, the term of this patent is extended or adjusted under 35 U.S.C. 154(b) by 333 days.

(21) Appl. No.: 18/052,802

(22) Filed: Nov. 4, 2022

(65) Prior Publication Data
US 2023/0143791 A1    May 11, 2023

(30) Foreign Application Priority Data
Nov. 10, 2021  (TW) .................. 110141840

(51) Int. Cl.
*H05K 1/02* (2006.01)
*H05K 1/03* (2006.01)
(Continued)

(52) U.S. Cl.
CPC ......... *H05K 1/0218* (2013.01); *H05K 1/0216* (2013.01); *H05K 1/0243* (2013.01);
(Continued)

(58) Field of Classification Search
CPC .... H05K 1/0218; H05K 1/0243; H05K 1/036; H05K 2201/09227; H05K 1/024
See application file for complete search history.

(56) References Cited

U.S. PATENT DOCUMENTS

| 6,441,313 B1 * | 8/2002 | Novak ............... H01L 23/50 257/E23.079 |
| 6,828,514 B2 * | 12/2004 | Chan ............... H05K 3/4623 174/262 |

(Continued)

FOREIGN PATENT DOCUMENTS

| CN | 101351923 A | 1/2009 |
| CN | 103222352 A | 7/2013 |

(Continued)

OTHER PUBLICATIONS

European Search Report dated Apr. 11, 2023 for European patent application No. 22205493.4.

*Primary Examiner* — Ishwarbhai B Patel

(57) ABSTRACT

A circuit board structure for mobile PCI express module is applied to conform to PCI Express 4.0 specification. The circuit board structure includes a top signal layer and a bottom signal layer with a core and a conductive copper wire, a power supply layer disposed between the top signal layer and the bottom signal layer, a plurality of first insulating layers disposed between the top signal layer and the power supply layer and between the bottom signal layer and the power supply layer, and a plurality of second insulating layers disposed between the power supply layer and the first insulating layers. The dielectric loss values of the first insulating layer and the second insulating layer are between 0.004 and 0.014, and the length of the conductive cooper wire is between 500 and 2500 mil, so that the signal loss of the mobile PCI express module is less than 8 dB.

10 Claims, 3 Drawing Sheets

(51) Int. Cl.
  *H05K 1/11*     (2006.01)
  *H05K 1/18*     (2006.01)
(52) U.S. Cl.
  CPC ............... *H05K 1/036* (2013.01); *H05K 1/11* (2013.01); *H05K 1/18* (2013.01)

(56) References Cited

U.S. PATENT DOCUMENTS

| | | | |
|---|---|---|---|
| 7,361,846 B2 * | 4/2008 | Chiang | H01L 23/49838 257/E23.105 |
| 2002/0153164 A1 * | 10/2002 | Cheng | H05K 3/4688 174/255 |
| 2005/0225955 A1 * | 10/2005 | Grebenkemper | H05K 1/0218 361/780 |
| 2013/0235545 A1 | 9/2013 | Ohmi et al. | |
| 2019/0050311 A1 | 2/2019 | Huddar et al. | |
| 2020/0275549 A1 | 8/2020 | Wig et al. | |

FOREIGN PATENT DOCUMENTS

| | | |
|---|---|---|
| CN | 105307390 A | 2/2016 |
| CN | 112335126 A | 2/2021 |
| TW | 200423848 A | 11/2004 |
| TW | 200742163 A | 11/2007 |
| TW | 201515538 A | 4/2015 |

\* cited by examiner

CIRCUIT BOARD STRUCTURE FOR MOBILE PCI EXPRESS MODULE

BACKGROUND OF THE INVENTION

1. Field of the Invention

The present invention relates to a circuit board structure, and more particularly, to a circuit board structure applied for mobile PCI express module to conform to PCI Express 4.0 specification of graphics processor.

2. Description of the Prior Art

Computers have become one of the indispensable communication devices in our daily lives, allowing people to process and transfer data through computers. With the rapid development of computer technology, portable notebook computers have been developed to bring further practicality and convenience to life.

Laptops can be used for business, fashion, and multimedia applications. Business laptops include high mobility and long battery life. Fashionable laptops have attractive aesthetic features. Multimedia application notebooks combine powerful graphics and multimedia processing capabilities with a certain level of mobility.

In generally, the notebook computer includes a motherboard on which the CPU, GPU, MXM, and other electronic components for processing data and signals are located. Currently, the Mobile PCI Express Module (MXM) for graphics data processing is only available in version 3.0, with data transfer and processing speed up to 8 GT/s and bandwidth up to 32 GB/s. With the rapid advancement of technology and people's living standards continue to improve, the bandwidth, performance, and speed of data processing in notebook computers are also increasing. Therefore, the electronic components of notebook computers need to be upgraded or replaced in order to meet consumer requirements. However, the board structure of the existing mobile PCI Express modules can only transfer and process data with a bandwidth of up to 32 BG/s. When the board structure handles data with a bandwidth greater than 32 GB/s and the transmission speed needs to be greater than 8.0 GT/s, the signal interference and signal loss of data transmission will increase significantly, which will reduce the quality and speed of signal transmission.

Therefore, it is necessary to develop a new type of circuit board structure to solve the problems of the prior art.

SUMMARY OF THE INVENTION

Therefore, the present invention provides a circuit board structure for mobile PCI express module to solve the problems of the prior art. According to one embodiment of the present invention, the circuit board structure for mobile PCI express module (MXM) is applied to conform to PCI Express 4.0 specification. The circuit board structure for mobile PCI express module includes a top signal layer, a bottom signal layer, at least one power supply layer, a plurality of first insulating layers and a plurality of second insulating layers. The bottom signal layer is opposite to the top signal layer, and the top signal layer and the bottom signal layer include a core and a conductive copper wire respectively. The conductive copper wire is disposed on the surface of the core for signal transmission. The power supply layer is disposed between the top signal layer and the bottom signal layer. The first insulating layers are disposed between the top signal layer and the power supply layer and disposed between the bottom signal layer and the power supply layer. The second insulating layers are disposed between the power supply layer and the first insulating layers. Wherein, the dielectric loss values of the first insulating layers and the second insulating layers are between 0.004 and 0.014 and the length of the conductive cooper wire is between 500 and 2500 mil, to reduce the signal loss of the mobile PCI express module less than 8 dB.

Wherein, the circuit board structure for mobile PCI express module of the present invention further includes a first ground layer. The first ground layer is disposed between the top signal layer and the power supply layer and located between the first insulating layers and the second insulating layers.

Wherein, the circuit board structure for mobile PCI express module of the present invention further includes a second ground layer. The second ground layer is disposed between the power supply layer and the bottom signal layer and located between the first insulating layers and the second insulating layers.

Moreover, the circuit board structure for mobile PCI express module of the present invention includes a first intermediate signal layer and a third ground layer. The first intermediate signal layer and the third ground layer are disposed between the top signal layer and the first ground layer, and the third ground layer is disposed between the top signal layer and the first intermediate signal layer. The first insulating layers are located among the top signal layer, the third ground layer, the first intermediate signal layer and the first ground layer respectively.

Moreover, the circuit board structure for mobile PCI express module of the present invention includes a second intermediate signal layer and a fourth ground layer. The second intermediate signal layer and the fourth ground layer are disposed between the bottom signal layer and the second ground layer, and the fourth ground layer is disposed between the bottom signal layer and the second intermediate signal layer. The first insulating layers are located among the bottom signal layer, the fourth ground layer, the second intermediate signal layer and the second ground layer respectively.

Wherein, the top signal layer and the bottom signal layer includes an impedance value respectively, and the impedance value is between 76.5 Ω and 93.5 Ω.

Furthermore, the conductive copper wire forms a plurality of arc-shaped wiring structures on the surface of the core.

Moreover, the conductive copper wire is disposed on the surface of the core in 10-degree trace.

Wherein, the material of the first insulating layers is epoxy resin composite material, and the epoxy resin composite material includes at least one of TU-883 and TU-863+.

Wherein, the thicknesses of the first insulating layers and the second insulating layers are between 0.05 mm and 0.08 mm.

In summary, the circuit board structure for mobile PCI express module of the present invention can efficiently reduce the signal loss of the signal layers and increase signal transmission quality and transmission speed through the insulating layers with super low loss materials and particular multi-layer stack structure, to conform to PCI Express 4.0 specification. Moreover, the signal layers of the circuit board structure for mobile PCI express module of the present invention can also reduce the signal loss and crosstalk through a variety of wire tracing methods.

BRIEF DESCRIPTION OF THE APPENDED DRAWINGS

DETAILED DESCRIPTION OF THE INVENTION

For the sake of the advantages, spirits and features of the present invention can be understood more easily and clearly, the detailed descriptions and discussions will be made later by way of the embodiments and with reference of the diagrams. It is worth noting that these embodiments are merely representative embodiments of the present invention, wherein the specific methods, devices, conditions, materials and the like are not limited to the embodiments of the present invention or corresponding embodiments. Moreover, the devices in the figures are only used to express their corresponding positions and are not drawing according to their actual proportion.

In the description of this specification, the description with reference to the terms "an embodiment", "another embodiment" or "part of an embodiment" means that a particular feature, structure, material or characteristic described in connection with the embodiment including in at least one embodiment of the present invention. In this specification, the schematic representations of the above terms do not necessarily refer to the same embodiment. Furthermore, the particular features, structures, materials or characteristics described may be combined in any suitable manner in one or more embodiments. Furthermore, the indefinite articles "a" and "an" preceding a device or element of the present invention are not limiting on the quantitative requirement (the number of occurrences) of the device or element. Thus, "a" should be read to include one or at least one, and a device or element in the singular also includes the plural unless the number clearly refers to the singular.

The circuit board structure for mobile PCI express module of the present invention can conform to PCI Express 4.0 specification, and can be applied to the bus interface of the graphics processor for conforming to the PCI Express 4.0 specification.

Figure 1:
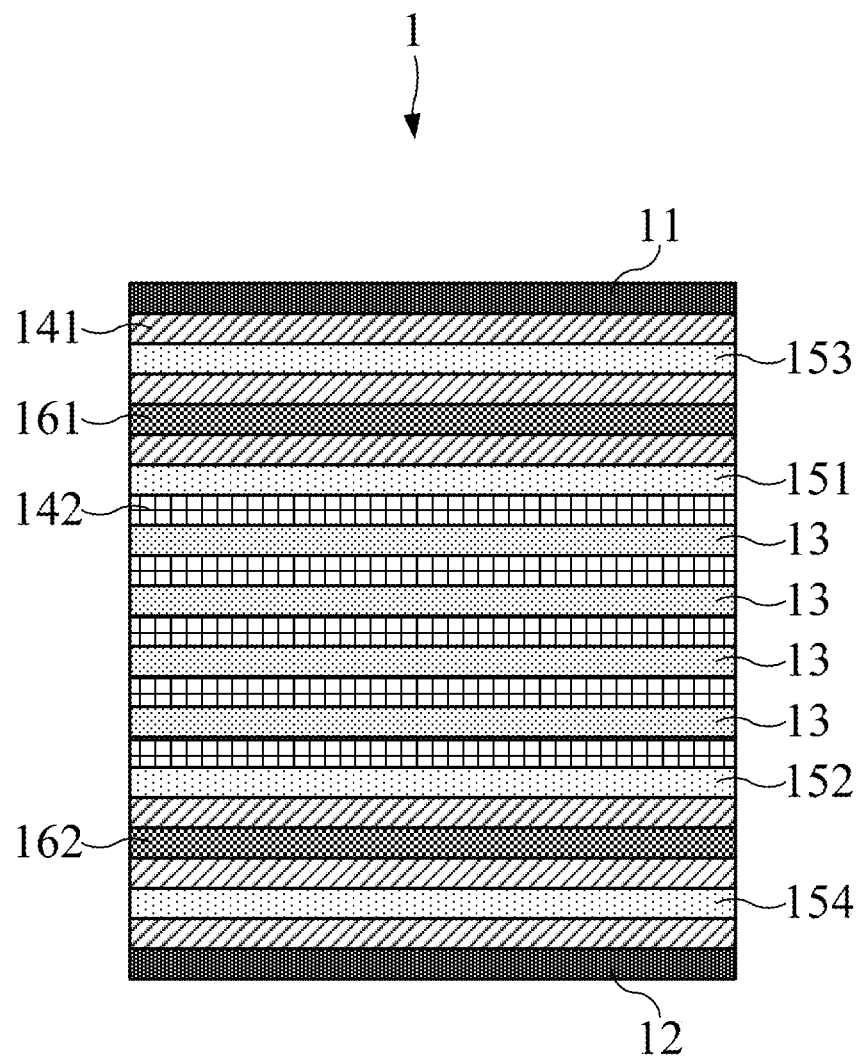
FIG. 1 is a structural schematic diagram illustrating a circuit board structure for mobile PCI express module according to an embodiment of the present invention.
Figure 2:
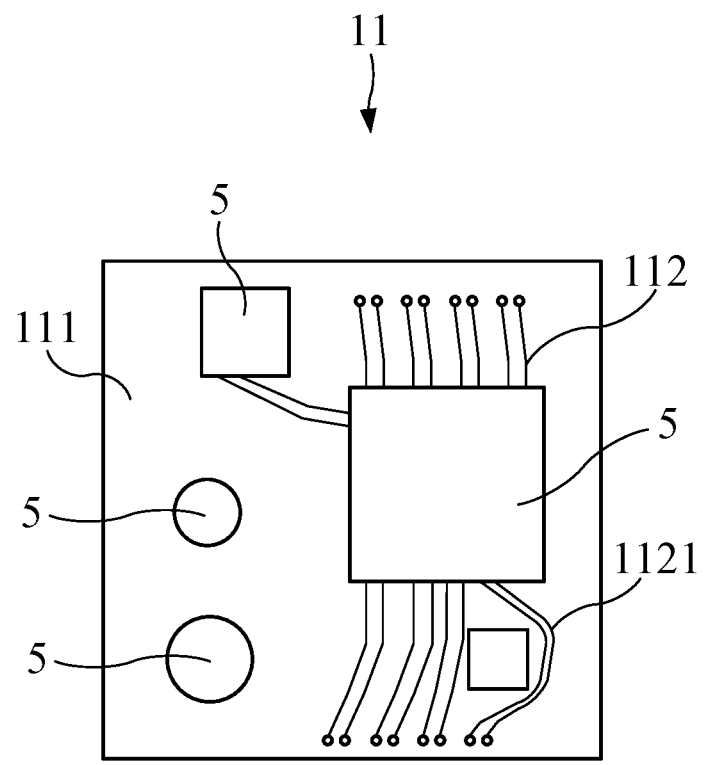
FIG. 2 is a structural schematic diagram illustrating the top signal layer according to an embodiment of the present invention.

Please refer to FIG. 1 and FIG. 2. FIG. 1 is a structural schematic diagram illustrating a circuit board structure for mobile PCI express module 1 according to an embodiment of the present invention. FIG. 2 is a structural schematic diagram illustrating the top signal layer 11 according to an embodiment of the present invention. As shown in FIG. 1, in this embodiment, the circuit board structure for mobile PCI express module 1 includes a top signal layer 11, a bottom signal layer 12, at least one power supply layer 13, a plurality of first insulating layers 141 and a plurality of second insulating layers 142. The bottom signal layer 12 is opposite to the top signal layer 11. The power supply layer 13 is disposed between the top signal layer 11 and the bottom signal layer 12. The first insulating layers 141 are disposed between the top signal layer 11 and the power supply layer 13 and disposed between the bottom signal layer 12 and the power supply layer 13. The second insulating layers 142 are disposed between the power supply layer 13 and the first insulating layers 141.

In practice, the circuit board structure for mobile PCI express module 1 can be a multilayer board structure. The top signal layer 11 and the bottom signal layer 12 are located at the outermost layers of the multilayer board respectively. The outer surfaces of the top signal layer 11 and the bottom signal layer 12 can be provided with electronic components such as passive components, integrated circuits, and chips respectively.

As shown in FIG. 2, the top signal layer 11 includes a core 111 and a plurality of conductive copper wires 112, and the conductive copper wires 112 are disposed on the surface of the core 111. In practice, the top signal layer 11 can be a copper clad laminate formed by hot pressing. The core 111 can be an insulating substrate composed of polymer synthetic resin and reinforcing materials (such as: paper substrate, glass fiber cloth substrate, synthetic fiber cloth substrate, non-woven substrate, composite substrate, etc.), and the electronic components 5 can be arranged on the surface of the core 111. Furthermore, the surface of the core 111 can be covered with a copper foil layer and etched to form conductive copper wires 112. The conductive copper wires 112 can be designed according to the position and distribution of the electronic components 5 disposed on the core board 111 and can be connected to the electronic components 5 to conduct the electronic components 5 and transmit signals. Moreover, the outer side of the top signal layer 11 can further includes a solder mask to prevent the electronic components 5 from contacting the conductive copper wires 112 when soldering on the core 111 to cause short circuit.

The bottom signal layer 12 can also includes the same core, conductive copper wires and solder mask as the top signal layer 11. The structures and functions of the core, conductive copper wires and solder mask are the same as the aforementioned components, it will not be described hereto. In this embodiment, the lengths of the conductive copper wires of the top signal layer 11 and the bottom signal layer 12 are between 500 mil and 2500 mil. It should be noted that the positions of the electronic components and the wire trace of the conductive copper wires of the bottom signal layer 12 can be different from those of the top signal layer 11 and can be design as requirements.

In this embodiment, the conductive copper wires 112 can form a plurality of arc-shaped wiring structures 1121 on the surface of the core 111. In practice, when the conductive copper wires 112 need to be turned the wire trace due to the circuit or the design of the electronic components 5, the arc-shaped wiring structure 1121 can avoid the acid traps caused by the right-angle or acute-angle wire trace, so as to reduce the impedance of conductive copper wires 112, thereby increasing the signal transmission quality. Moreover, the conductive copper wire 112 can be disposed on the surface of the core 111 in 10-degree trace. In practice, the conductive copper wire 112 with 10-degree wire trace can efficiently decrease influence of uneven dielectric constant of the core 111 and the impedance of signal transmission, thereby improving the signal transmission quality and reducing signal loss and crosstalk among the conductive copper wires 112. In this embodiment, the impedance values of the top signal layer 11 and the bottom signal layer 12 are between 76.5 Ω and 93.5 Ω, but it is not limited in practice. The impedance values of the top signal layer 11 and the bottom signal layer 12 can also be determined as design or requirement.

As shown in FIG. 1, in this embodiment, the power supply layer 13 is disposed between the top signal layer 11 and the bottom signal layer 12 for providing power to the electronic components arranged on the top signal layer 11 and the bottom signal layer 12. In practice, when the electronic components applied to the circuit board structure for mobile PCI express module 1 need to be driven by a variety of different voltages or currents, the power supply layer 13 can be multilayer power plane structure. As shown in FIG. 1, the number of the power supply layer 13 is four, but it is not limited thereto. The number of the power supply layer 13 can be determined as design. In one embodiment, the power supply layer can also be a single layer structure.

In this embodiment, the first insulating layers 141 are disposed between the top signal layer 11 and the power supply layer 13 and between the bottom signal layer 12 and the power supply layer 13. The second insulating layers 142 are disposed between the power supply layer 13 and the first insulating layers 141. Furthermore, the second insulating layers 142 are arranged alternately with the plurality of power supply layers 13. In practice, the first insulating layers 141 and the second insulating layers 142 are dielectric layers (the prepreg layers). The first insulating layers 141 and the second insulating layers 142 are alternately arranged among the top signal layer 11, the bottom signal layer 12 and the power supply layer 13 to avoid the short circuit of the signal layers and power supply layers. Moreover, the thicknesses of the first insulating layer 141 and the second insulating layer 142 can be between 0.05 mm and 0.08 mm, and the dielectric loss values (Dissipation Factor, DF) of the first insulating layer 141 and the second insulating layer 142 can be between 0.004 and 0.014. As shown in FIG. 1, the structure from top to bottom of the circuit board structure for mobile PCI express module 1 is arranged as the top signal layer 11, the first insulating layer 141, the power supply layer 13, the second insulating layer 142, the power supply layer 13, the first insulating layer 141 and the bottom signal layer 12. The materials of the first insulating layer 141 and the second insulating layer 142 can be the epoxy resin composite material, such as FR-4, FR-5, FR-6, CEM-1~CEM-5. Furthermore, the materials of the first insulating layer 141 and the second insulating layer 142 can include low loss materials or super low loss materials. In one embodiment, the material of the first insulating layer 141 includes TU-883 or TU863+, and the material of the second insulating layer 142 includes TU-865. That is to say, the first insulating layer 141 is a composite material of epoxy combined with TU-883 or TU863+, and the second insulating layer 142 is a composite material of epoxy combined with TU-865. Therefore, when the top signal layer 11, the bottom signal layer 12, the power supply layer 13, the first insulating layer 141 and the second insulating layer 142 form the circuit board structure for mobile PCI express module 1 by hot pressing, the first insulating layer 141 and the second insulating layer 142 can maintain the signal transmission quality and reduce the signal loss of the top signal layer 11, the bottom signal layer 12 and the power supply layer 13.

It should be noted that the material of the first insulating layer 141 is not limited to include the aforementioned TU-883 and TU863+, and the material of the second insulating layer 142 is not limited to include the aforementioned TU-865. The materials of the first insulating layer 141 and the second insulating layer 142 can also include other low loss material or super low loss materials and can be determined as design or requirement. Moreover, the material of the second insulating layer 142 can also be the same as the material of the first insulating layer 141. Furthermore, when the power supply layer 13 is the single layer structure, the second insulating layers 142 can be disposed on the two opposite sides of the power supply layer 13.

In this embodiment, the circuit board structure for mobile PCI express module 1 further includes a first ground layer 151 and a second ground layer 152. The first ground layer 151 is disposed between the the top signal layer 11 and the power supply layer 13 and between the first insulating layer 141 and the second insulating layer 142. The second ground layer 152 is disposed between the power supply layer 13 and the bottom signal layer 12 and between the first insulating layer 141 and the second insulating layer 142. As shown in FIG. 1, the structure from top to bottom of the circuit board structure for mobile PCI express module 1 is arranged as the top signal layer 11, the first insulating layer 141, the first ground layer 151, the second insulating layer 142, the power supply layer 13, the second insulating layer 142, the second ground layer 152, the first insulating layer 141 and the bottom signal layer 12. In practice, the first ground layer 151 is configured to ground and separate the top signal layer 11 and the power supply layer 13 to prevent crosstalk between the top signal layer 11 and the power supply layer 13. Moreover, the first ground layer 151 can also form a coupling capacitor with the adjacent power layer 13, which can not only reduce the impedance of the power layer 13 and the first ground layer 151, but also enable the power layer 13 to obtain a wider filtering effect, thereby improving the signal transmission quality and transmission speed. Similarly, the second ground layer 152 is configured to ground and separate the bottom signal layer 12 and the power supply layer 13, and the second ground layer 152 can also form a coupling capacitor with the adjacent power layer 13 to prevent crosstalk between the bottom signal layer 12 and the power supply layer 13, and to improve the signal transmission quality and transmission speed. Therefore, the circuit board structure for mobile PCI express module of present invention can efficiently reduce the signal loss and increase signal transmission quality and transmission speed through the insulating layers with super low loss materials and particular multi-layer stack structure to comply with PCI Express 4.0 specification.

In this embodiment, the circuit board structure for mobile PCI express module 1 further includes a first intermediate signal layer 161 and a third ground layer 153. The first intermediate signal layer 161 and the third ground layer 153 are disposed between the top signal layer 11 and the first ground layer 151, and the third ground layer 153 is disposed between the top signal layer 11 and the first intermediate signal layer 161. The first insulating layers 141 are disposed among the top signal layer 11, the third ground layer 153, the first intermediate signal layer 161 and the first ground layer 151 respectively. With the miniaturization of electronic products and high-speed data transmission, circuit boards contain not only the signal layers on the outermost two sides, but also the signal layers inside the circuit board to increase the data transmission capacity and speed. As shown in FIG. 1, the structure between the top signal layer 11 and the power supply layer 13 of the circuit board structure for mobile PCI express module 1 is arranged as the top signal layer 11, the first insulating layer 141, the third ground layer 153, the first insulating layer 141, the first intermediate signal layer 161, the first insulating layer 141, the first ground layer 151, the second insulating layer 142 and the power supply layer 13. In practice, the first intermediate signal layer 161 can include aforementioned core and conductive copper wires and transmit signal. The third ground layer 153 is configured to ground and separate the top signal layer 11 and the first intermediate signal layer 161 to prevent crosstalk between the top signal layer 11 and the first intermediate signal layer 161.

Moreover, in this embodiment, the circuit board structure for mobile PCI express module 1 further includes a second intermediate signal layer 162 and a fourth ground layer 154. The second intermediate signal layer 162 and the fourth ground layer 154 are disposed between the bottom signal layer 12 and the second ground layer 152, and the fourth ground layer 154 is disposed between the bottom signal layer 12 and the second intermediate signal layer 162. The first insulating layers 141 are disposed among the bottom signal layer 12, the fourth ground layer 154, the second intermediate signal layer 162 and the second ground layer 152 respectively. As shown in FIG. 1, the structure between the power supply layer 13 and the bottom signal layer 12 of the circuit board structure for mobile PCI express module 1 is arranged as the power supply layer 13, the second insulating layer 142, the second ground layer 152, the first insulating layer 141, the second intermediate signal layer 162, the first insulating layer 141, the fourth ground layer 154, the first insulating layer 141 and the bottom signal layer 12. In practice, the second intermediate signal layer 162 can include aforementioned core and conductive copper wires and transmit signal. The fourth ground layer 154 is configured to ground and separate the bottom signal layer 12 and the second intermediate signal layer 162 to prevent crosstalk between the bottom signal layer 12 and the second intermediate signal layer 162.

It should be noted that the number of the internal signal layer of the circuit board structure for mobile PCI express module 1 is not limited to two in FIG. 1 (the first intermediate signal layer 161 and the second intermediate signal layer 162). In practice, the number of the internal signal layer of the circuit board structure for mobile PCI express module can be one or more than three.

Figure 3:
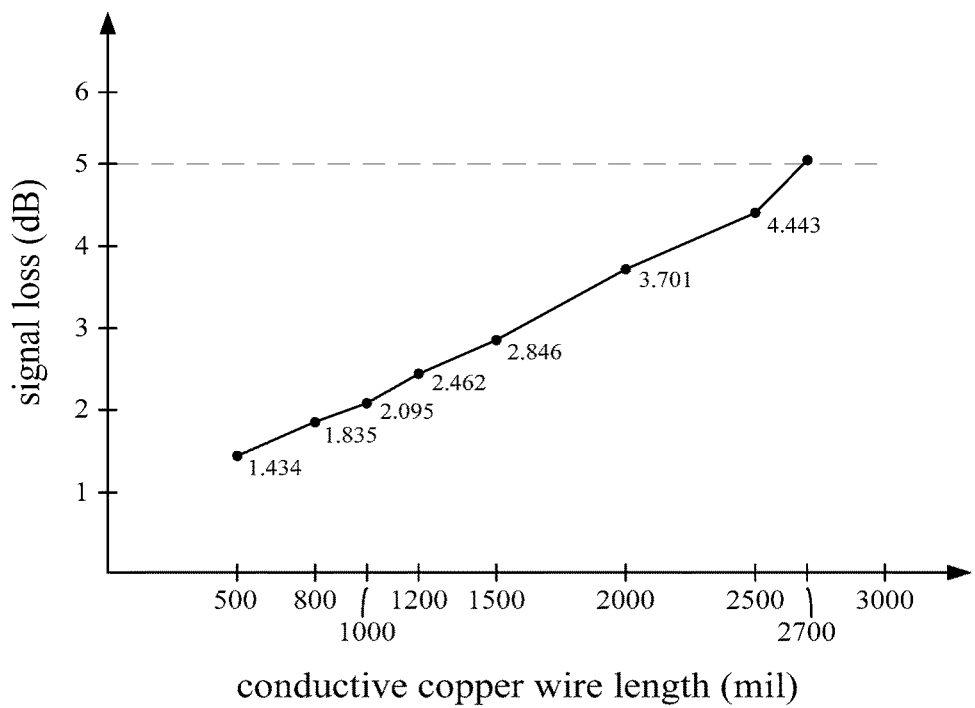
FIG. 3 is a signal loss schematic diagram illustrating the circuit board structure for mobile PCI express module according to an embodiment of the present invention.
Figure 4:
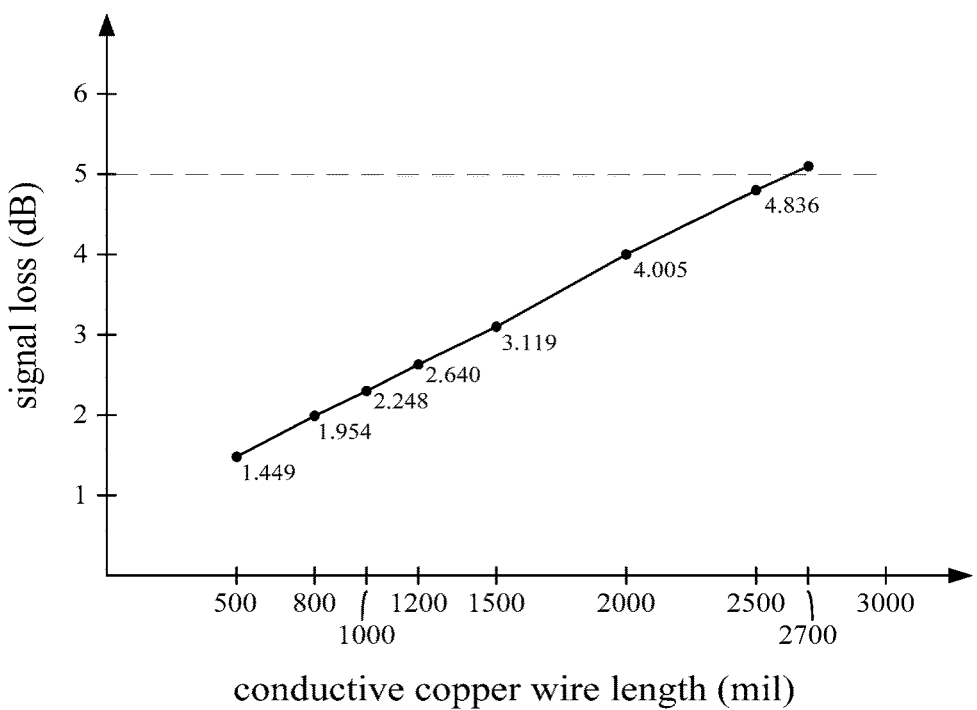
FIG. 4 is a signal loss schematic diagram illustrating the circuit board structure for mobile PCI express module according to another embodiment of the present invention.

Please refer to FIG. 1, FIG. 3 and FIG. 4. FIG. 3 is a signal loss schematic diagram illustrating the circuit board structure for mobile PCI express module 1 according to an embodiment of the present invention. FIG. 4 is a signal loss schematic diagram illustrating the circuit board structure for mobile PCI express module 1 according to another embodiment of the present invention. As shown in FIG. 3 and FIG. 4, the X-axis is the length of the conductive copper wire (mil), and the Y-axis is the signal loss value (dB). As shown in FIG. 3, in a preferred embodiment, when the material of the first insulating layer 141 is super low loss material TU-883, the material of the second insulating layer 142 is TU-865, the impedance values of the top signal layer 11 and the bottom signal layer 12 is 85 Ω, and the length of the conductive copper wire is between 500 mil and 2500 mil, the signal loss of the mobile PCI express module can be less than 8 dB, and the signal loss of the circuit board structure for mobile PCI express module 1 can be less than 5 dB. In practice, external/plug-in graphics processing modules are required to have less than 8 dB of signal loss in the PCI Express 4.0 specification. Furthermore, the signal loss due to electronic components in the package is about 3 dB, which means that the signal loss of the circuit board structure for mobile PCI express module needs to be less than 5 dB. As shown in FIG. 4, in a preferred embodiment, when the material of the first insulating layer 141 is low loss material TU-863+, the material of the second insulating layer 142 is TU-865, the impedance values of the top signal layer 11 and the bottom signal layer 12 is 85 Ω, and the length of the conductive copper wire is between 500 mil and 2500 mil, the signal loss of the circuit board structure for mobile PCI express module 1 can also be less than 5 dB. Therefore, the circuit board structure for mobile PCI express module of present invention can effectively reduce the signal loss value by selecting the materials of the insulating layers, the length of the conductive copper wire, and the impedance values of the signal layers, so that the circuit board structure for mobile PCI express module can comply with the PCI Express 4.0 specification.

In summary, the circuit board structure for mobile PCI express module of the present invention can efficiently reduce the signal loss of the signal layers and increase signal transmission quality and transmission speed through the insulating layers with super low loss materials and particular multi-layer stack structure, to conform to PCI Express 4.0 specification. Moreover, the signal layers of the circuit board structure for mobile PCI express module of the present invention can also reduce the signal loss and crosstalk through a variety of wire tracing methods.

With the examples and explanations mentioned above, the features and spirits of the invention are hopefully well described. More importantly, the present invention is not limited to the embodiment described herein. Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A circuit board structure for mobile PCI express module applied to conform to PCI Express 4.0 specification, the circuit board structure for mobile PCI express module comprising:
    a top signal layer;
    a bottom signal layer, located on one side opposite to the top signal layer, wherein the top signal layer and the bottom signal layer both comprising a core and a conductive copper wire respectively, the conductive copper wire being configured on the surface of the core for signal transmission;
    at least one power supply layer, configured between the top signal layer and the bottom signal layer;
    a plurality of first insulating layers, configured between the top signal layer and the power supply layer and configured between the bottom signal layer and the power supply layer; and
    a plurality of second insulating layers, configured between the power supply layer and the first insulating layers;
    wherein, the dielectric loss values of the first insulating layers and the second insulating layers are between 0.004 and 0.014 and the length of the conductive copper wire is between 500 and 2500 mil, to reduce the signal loss of the mobile PCI express module less than 8 dB.

2. The circuit board structure for mobile PCI express module of claim 1, further comprising a first ground layer, the first ground layer being configured between the top signal layer and the power supply layer and located between the first insulating layers and the second insulating layers.

3. The circuit board structure for mobile PCI express module of claim 2, further comprising a first intermediate signal layer and a third ground layer configured between the top signal layer and the first ground layer, and the third ground layer being configured between the top signal layer and the first intermediate signal layer, the first insulating layers being located among the top signal layer, the third ground layer, the first intermediate signal layer and the first ground layer respectively.

4. The circuit board structure for mobile PCI express module of claim 1, further comprising a second ground layer, the second ground layer being configured between the power supply layer and the bottom signal layer and located between the first insulating layers and the second insulating layers.

5. The circuit board structure for mobile PCI express module of claim 4, further comprising a second intermediate signal layer and a fourth ground layer configured between the bottom signal layer and the second ground layer, and the fourth ground layer being configured between the bottom signal layer and the second intermediate signal layer, the first insulating layers being located among the bottom signal layer, the fourth ground layer, the second intermediate signal layer and the second ground layer respectively.

6. The circuit board structure for mobile PCI express module of claim 1, wherein the top signal layer and the bottom signal layer comprises an impedance value respectively, and the impedance value is between 76.5 Ω and 93.5 Ω.

7. The circuit board structure for mobile PCI express module of claim 1, wherein the conductive copper wire forms a plurality of arc-shaped wiring structures on the surface of the core.

8. The circuit board structure for mobile PCI express module of claim 1, wherein the conductive copper wire is configured on the surface of the core in 10-degree trace.

9. The circuit board structure for mobile PCI express module of claim 1, wherein the material of the first insulating layers is epoxy resin composite material, and the epoxy resin composite material comprises at least one of super low loss material and low loss material.

10. The circuit board structure for mobile PCI express module of claim 1, wherein the thicknesses of the first insulating layers and the second insulating layers are between 0.05 mm and 0.08 mm.

* * * * *